United States Patent
Durbha et al.

(10) Patent No.: US 8,766,692 B1
(45) Date of Patent: Jul. 1, 2014

(54) SUPPLY VOLTAGE INDEPENDENT SCHMITT TRIGGER INVERTER

(75) Inventors: Chandrika Durbha, Dublin (IE); Edward Cullen, Clane (IE); Ionut C. Cical, Dublin (IE)

(73) Assignee: Xilinx, Inc., San Jose, CA (US)

( * ) Notice: Subject to any disclaimer, the term of this patent is extended or adjusted under 35 U.S.C. 154(b) by 696 days.

(21) Appl. No.: 12/794,914

(22) Filed: Jun. 7, 2010

(51) Int. Cl.
*H03K 3/00* (2006.01)
*H03K 3/2893* (2006.01)

(52) U.S. Cl.
CPC ................................ *H03K 3/2893* (2013.01)
USPC ........................................................ 327/205

(58) Field of Classification Search
USPC ................................................. 327/205, 206
See application file for complete search history.

(56) References Cited

U.S. PATENT DOCUMENTS

| | | | | |
|---|---|---|---|---|
| 7,183,826 | B2* | 2/2007 | Hashimoto | 327/205 |
| 7,227,400 | B1* | 6/2007 | Gillespie et al. | 327/333 |
| 2004/0108521 | A1* | 6/2004 | Lim et al. | 257/200 |

* cited by examiner

*Primary Examiner* — Sibin Chen
(74) *Attorney, Agent, or Firm* — Kevin T. Cuenot; LeRoy D. Maunu

(57) ABSTRACT

A Schmitt trigger inverter circuit can include a first inverter. The first inverter can include a first pull-up device, a first pull-down device and a second pull-down device. The first inverter can receive an input signal. The Schmitt trigger inverter circuit can include a second inverter coupled in series with the first inverter and including an output that generates an output signal. The Schmitt trigger inverter circuit further can include a switch coupled to the output of the second inverter circuit and that is selectively enabled by the output signal. The switch can couple a predetermined reference voltage to a source terminal of the first pull-down device when in an enabled state. Coupling the predetermined reference voltage to the source terminal of the first pull-down device can alter a threshold voltage of the Schmitt trigger inverter circuit.

18 Claims, 3 Drawing Sheets

SUPPLY VOLTAGE INDEPENDENT SCHMITT TRIGGER INVERTER

FIELD OF THE INVENTION

The embodiments disclosed within this specification relate to semiconductor integrated circuits (ICs). More particularly, the embodiments relate to a Schmitt trigger inverter circuit for an IC.

BACKGROUND

A Schmitt trigger inverter refers to a type of inverter circuit that alters the threshold voltage at which an output signal of the Schmitt trigger inverter changes state dependent upon whether the input signal to the Schmitt trigger inverter is increasing or decreasing. When the input signal is increasing and higher than a first selected threshold voltage, the output is a logic low. When the input signal is decreasing and below a second selected threshold voltage, the output is a logic high. When the input signal resides between the two selected threshold voltages, the output signal retains its state. The Schmitt trigger inverter retains its state until the input signal exceeds the appropriate threshold voltage to "trigger" a state change. The Schmitt trigger inverter is said to have memory due to the existence of the two distinct threshold voltage levels, with each threshold voltage being dependent upon the slope of the input signal. The presence of memory implies the presence of hysteresis within the Schmitt trigger inverter. Hysteresis generally refers to the dependence of the current state of a system on the history of the system.

Schmitt trigger inverter architectures are typically used to improve the noise and/or the distortion immunity of an inverter circuit. Conventional inverters switch as their input signal crosses a single threshold voltage regardless of the previous state of the inverter. When the input signal to a conventional inverter resides close to the singular threshold voltage, any noise appearing within the input signal can cause the voltage of the input signal to transition back and forth across the threshold voltage. For example, as large blocks of digital circuits within an IC are switched, a noise signal associated with the switching can propagate within the IC and appear at the input to, or within, a supply voltage powering the inverter. The noise within the input signal can result in unintended changes in the output state of the inverter.

The presence of hysteresis within the Schmitt trigger inverter can prevent the output state of the Schmitt trigger inverter from being changed by noise so long as the noise resides within the voltage range between the two threshold voltages selected for the Schmitt trigger inverter. In this manner, noise is prevented from altering the output state of the Schmitt trigger inverter or, in a worst case, causing the Schmitt trigger inverter to oscillate. As such, Schmitt trigger inverters are frequently used within ICs generating, or operating within, high noise environments.

SUMMARY

The embodiments disclosed within this specification relate to integrated circuits (ICs) and, more particularly, to a Schmitt trigger inverter circuit (Schmitt trigger). In one embodiment, a Schmitt trigger can include a first inverter including a first pull-up device, a first pull-down device, and a second pull-down device. The first inverter can be configured to receive an input signal. The Schmitt trigger also can include a second inverter coupled in series with the first inverter and include an output configured to generate an output signal. The Schmitt trigger can include a switch coupled to the output of the second inverter. The switch can be selectively enabled responsive to the output signal. The switch can be configured to couple a predetermined reference voltage to a source terminal of the first pull-down device when in an enabled state. Coupling the predetermined reference voltage can alter a threshold voltage of the Schmitt trigger.

In one aspect, a voltage range of the output signal of the second inverter can vary between a ground potential and the predetermined reference voltage. The predetermined reference voltage can be independent of a supply voltage powering the Schmitt trigger.

The switch can include a P-type field effect transistor (PFET) device. The PFET device can include a gate terminal coupled to the output of the second inverter, a source terminal coupled to the predetermined reference voltage, and a drain terminal coupled to the source terminal of the first pull-down device.

The first inverter can include a second pull-up device including a source terminal coupled to a drain terminal of the first pull-up device and a gate terminal coupled to a first bias voltage. The first inverter also can include a third pull-down device including a source terminal coupled to a drain terminal of the first pull-down device, a drain terminal coupled to a drain terminal of the second pull-up device, and a gate terminal coupled to a second bias voltage.

In another aspect, the first pull-up device and the second pull-up device each can include a PFET device. The first bias voltage can be set to a selected voltage that limits a voltage across each of the first pull-up device and the second pull-up device to not exceed a voltage tolerance associated with each respective device during operation of the Schmitt trigger.

The first pull-down device, the second pull-down device, and the third pull-down device each can include an N-type field effect transistor (NFET) device. The second bias voltage can be set to a selected voltage that limits a voltage across each of the first pull-down device, the second pull-down device, and the third pull-down device to not exceed a voltage tolerance associated with each respective device during operation of the Schmitt trigger.

The second inverter can include a second pull-up device including a drain terminal, a source terminal coupled to a supply voltage powering the Schmitt trigger, and a gate terminal coupled to the output of the first inverter. The second inverter can include a third pull-up device including a drain terminal, a source terminal coupled to the drain terminal of the second pull-up device, and a gate terminal coupled to a first bias voltage. The second inverter also can include a third pull-down device including a source terminal, a drain terminal coupled to the drain terminal of the third pull-up device, and a gate terminal coupled to the predetermined reference voltage. The second inverter further can include a fourth pull-down device including a drain terminal coupled to the source terminal of the third pull-down device, a source terminal coupled to a ground potential, and a gate terminal coupled to the output of the first inverter. The output of the second inverter can be a node coupling the source terminal of the third pull-down device and the drain terminal of the fourth pull-down device. In one aspect, the second pull-up device and the third pull-up device each can include a PFET device. Further, the third pull-down device and the fourth pull-down device each can include an NFET device.

Another embodiment can include a Schmitt trigger disposed in a complementary metal oxide semiconductor (CMOS) IC. The Schmitt trigger can include a first inverter including a first PFET device, a first NFET device, and a second NFET device, wherein the first inverter is configured to receive an input signal. A second inverter can be included that is coupled in series with an output of the first inverter. The second inverter can include an output configured to generate an output signal. The Schmitt trigger can include a PFET switch including a gate terminal coupled to an output of the second inverter, a source terminal coupled to a predetermined reference voltage, and a drain terminal coupled to the source terminal of the first NFET device. The PFET switch can be configured to couple the predetermine voltage to the source terminal of the first NFET device when in an enabled state. The predetermined reference voltage can be independent of a supply voltage powering the Schmitt trigger.

In one aspect, a voltage range of the output signal of the second inverter can vary between a ground potential and the predetermined reference voltage.

The first inverter can include a second PFET device including a source terminal coupled to a drain terminal of the first PFET device and a gate terminal coupled to a first bias voltage. The first inverter also can include a third NFET device including a source terminal coupled to a drain terminal of the first NFET device, a drain terminal coupled to a drain terminal of the second PFET device, and a gate terminal coupled to a second bias voltage.

The first bias voltage and the second bias voltage each can be selected, so that, for each PFET device and NFET device used to implement the Schmitt trigger, voltage across each PFET device and NFET device does not exceed a voltage tolerance associated with each respective device during operation of the Schmitt trigger.

The second inverter can include a second PFET device including a drain terminal, a source terminal coupled to the supply voltage, and a gate terminal coupled to the output of the first inverter and a third PFET device including a drain terminal, a source terminal coupled to the drain terminal of the second PFET device, and a gate terminal coupled to a bias voltage. The second inverter can include a third NFET device including a source terminal, a drain terminal coupled to the drain terminal of the third PFET device, and a gate terminal coupled to the predetermined reference voltage. A fourth NFET device can be included that has a drain terminal coupled to the source terminal third NFET device, a source terminal coupled to a ground potential, and a gate terminal coupled to the output of the first inverter. The output of the second inverter can be a node coupling the source terminal of the third NFET device and the drain terminal of the fourth NFET device.

Another embodiment can include a Schmitt trigger. The Schmitt trigger can include a first inverter including a first pull-up device, a first pull-down device, and a second pull-down device, wherein the first inverter is configured to receive an input signal. A second inverter can be included that is coupled in series with the first inverter. The second inverter can include an output configured to generate an output signal. A voltage range of the output signal can vary between a ground potential and a predetermined reference voltage. The predetermined reference voltage can be independent of a supply voltage powering the Schmitt trigger. The Schmitt trigger also can include a switch coupled to the output of the second inverter. The switch can be selectively enabled responsive to the output signal. The switch can be configured to couple a predetermined reference voltage to a source terminal of the first pull-down device when in an enabled state. Coupling the predetermined reference voltage can alter a threshold voltage of the Schmitt trigger.

The first inverter can include a second pull-up device including a source terminal coupled to a drain terminal of the first pull-up device and a gate terminal coupled to a first bias voltage. The first inverter also can include a third pull-down device including a source terminal coupled to a drain terminal of the first pull-down device, a drain terminal coupled to a drain terminal of the second pull-up device, and a gate terminal coupled to a second bias voltage.

The switch can include a PFET device. The PFET device can include a gate terminal coupled to the output of the second inverter, a source terminal coupled to the predetermined reference voltage, and a drain terminal coupled to the source terminal of the first pull-down device.

The second inverter can include a second pull-up device including a drain terminal, a source terminal coupled to a supply voltage powering the Schmitt trigger, and a gate terminal coupled to the output of the first inverter. A third pull-up device can be included that has a drain terminal, a source terminal coupled to the drain terminal of the second pull-up device, and a gate terminal coupled to a first bias voltage. The second inverter can include a third pull-down device and a fourth pull-down device. The third pull-down device can include a source terminal, a drain terminal coupled to the drain terminal of the third pull-up device, and a gate terminal coupled to the predetermined reference voltage. The fourth pull-down device can include a drain terminal coupled to the source terminal of the third pull-down device, a source terminal coupled to the ground potential, and a gate terminal coupled to the output of the first inverter. The output of the second inverter can be a node coupling the source terminal of the third pull-down device and the drain terminal of the fourth pull-down device.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the embodiments of the invention.

The embodiments disclosed within this specification relate to integrated circuits (ICs) and, more particularly, to a Schmitt trigger type of inverter circuit that can be used within an IC. In accordance with one or more embodiments disclosed herein, a Schmitt trigger inverter circuit is provided that can function independently of a supply voltage. The Schmitt trigger inverter circuit can be implemented within a complementary metal oxide semiconductor (CMOS) type of IC. The Schmitt trigger inverter circuit can include a first inverter that receives an input signal and a second inverter coupled in series with the first inverter. An output signal from the second inverter can enable a switch that generates hysteresis within the Schmitt trigger inverter circuit. Enabling the switch can couple a predetermined reference voltage to a node within the first inverter.

Hysteresis can be generated within the Schmitt trigger inverter circuit by closing or opening the switch, thereby coupling or uncoupling the predetermined reference voltage from the node within the first inverter. The application of the predetermined reference voltage shifts a threshold voltage at which the Schmitt trigger inverter circuit changes state. The predetermined reference voltage coupled to the first inverter and the voltage range of the output signal from the second inverter used to enable the switch can be independent of the supply voltage. As a result, the amount of hysteresis generated within the Schmitt trigger inverter circuit can remain constant despite variations that can occur in the supply voltage.

Figure 1:
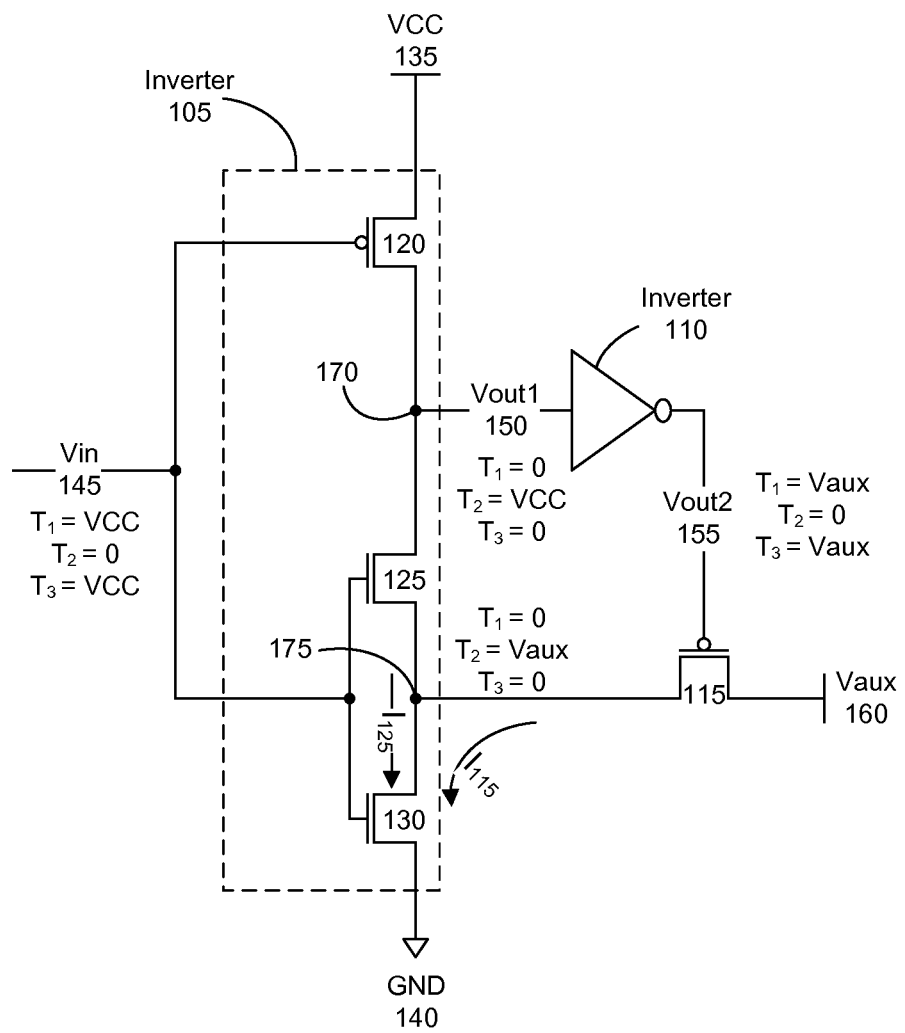
FIG. 1 is a first schematic diagram illustrating a Schmitt trigger inverter circuit in accordance with one embodiment.

FIG. 1 is a first schematic diagram illustrating a Schmitt trigger inverter circuit (Schmitt trigger) 100. Schmitt trigger 100 can provide a predetermined quantity of hysteresis that is independent of variations in a supply voltage powering Schmitt trigger 100. Schmitt trigger 100 can include an inverter 105, an inverter 110, and a switch 115.

Inverter 105 can include a pull-up device 120 and pull-down devices 125 and 130. Coupled together in series between supply voltage VCC 135 and ground denoted as GND 140, pull-up device 120, pull-down device 125, and pull-down device 130, form a first inverter of Schmitt trigger 100. The gate terminal of pull-up device 120 can receive signal Vin 145. When enabled by signal Vin 145, pull-up device 120 can couple VCC 135 to pull-down device 125. The gate terminal of each of pull-down devices 125 and 130 can receive signal Vin 145. When enabled by signal Vin 145, pull-down device 125 can couple pull-up device 120 to pull-down device 130. When enabled by signal Vin 145, pull-down device 130 can couple pull-down device 125 to GND 140. Inverter 105 can generate output signal Vout1 150.

A "pull-up" or "pull-down" device can refer to a transistor that can functionally operate as a switch and, when enabled, couple a first node of a circuit at a predetermined reference voltage to a second node of the circuit. Depending upon the relative voltage differential between the first node and the second node, the transistor can be classified as a pull-up or a pull-down type of device. A pull-up device can source current to pull-up the voltage at the second node. A pull-down device can sink current to pull-down the voltage at the second node.

The term "couple" can refer to the formation of an electrical connection between two or more nodes that allows the exchange of an electrical property, such as a voltage, a current, or a signal, between the nodes. For example, the output of a first inverter can be coupled to the input of a second inverter allowing an output signal of the first inverter to be received as an input signal by the second inverter. The closing of a switch between two nodes can be said to "couple" the two nodes together, thereby allowing current to flow between the two nodes. In another example, the enabling of a CMOS device can create a current path from the source terminal of the CMOS device through the body of the CMOS device to the drain terminal of the CMOS device, thereby coupling a node at the source terminal to a node at the drain terminal. Thus, a node at a drain terminal of a CMOS device and a node at a source terminal of the CMOS device can be said to be coupled when the CMOS device is enabled, and decoupled when the CMOS device is disabled.

Throughout this specifications pull-up devices are depicted as being P-type field effect transistors (PFETs) and pull-down devices are depicted as being N-type field effect transistors (NFETs). Although illustrated in this manner, pull-up devices and pull-down devices can be implemented with either complementary CMOS device. As such, the use of PFETs for pull-up devices and NFETs for pull-down devices, as described within this specification, is for descriptive purposes only and is not intended to limit the embodiments disclosed within this specification.

Inverter 110 can include an input coupled to the output of inverter 105. The output of inverter 105 is illustrated within FIG. 1 as node 170. The input of inverter 110 can receive signal Vout1 150. The output of inverter 110 is coupled to a gate terminal of switch 115. A source terminal of switch 115 is coupled to Vaux 160. Vaux 160 can be a predetermined reference voltage less than, and independent of, VCC 135. A drain terminal of switch 115 can be coupled to a drain terminal of pull-down device 130 and a source terminal of pull-down device 125, which is illustrated within FIG. 1 as node 175.

In operation, Schmitt trigger 100 can display hysteresis with a threshold voltage at which Schmitt trigger 100 changes state. The threshold voltage can vary depending upon a current logic state of Schmitt trigger 100 prior to any change in the state of the logic. An operating point of nodes within Schmitt trigger 100 varies as Schmitt trigger 100 changes logic states, e.g., from a logic high to a logic low. This change of operating point of nodes within Schmitt trigger 100, as Schmitt trigger 100 changes states, results in Schmitt trigger 100 behaving differently when receiving an input signal transitioning from a logic high to a logic low than the input signal transitioning from a logic low to a logic high.

Throughout this specification, signals are described in terms of logic levels, e.g., a logic high or a logic low, where the difference between a logic high and a logic low can represent a full output voltage range of a circuit. In general, the voltage associated with a logic high and a logic low is approximately equal to the voltage of each associated supply rail powering the circuit. The lowest and highest voltages to the circuit can be provided by a power supply coupled to an IC within which the circuit is implemented. Alternatively, a predetermined reference voltage can be generated, and/or used, within the IC to implement one end of the full output range of a circuit and thereby implement a logic state within the IC.

Throughout this specification reference is made to various voltage sources to which components of Schmitt trigger 100 can be coupled. As such, each voltage source can represent a node to which a component can be coupled as well as a particular voltage potential associated with that node. For example, the source terminal of pull-up device 120 is coupled the voltage source VCC 135. Being coupled to VCC 135, the voltage of VCC is present at the source terminal of pull-up device 120. Thus, when referring to a node, reference numbers will be used. When referring to a voltage, the symbol, e.g., VCC or GND, generally will be used unaccompanied by the reference numbers. Similarly, a circuit whose output voltage range is limited to the voltage of the voltage sources powering the circuit can be said to vary between the voltages associated with each voltage source powering the circuit. For example, inverter 105 is coupled to, and powered by, voltage sources VCC 135 and GND 140. Being powered by voltage sources VCC 135 and GND 140, the voltage range of an output signal from inverter 105 can be referred to generally as varying between VCC and GND.

A "voltage range" can refer to a voltage differential between a highest and a lowest voltage provided, or specified, by a signal or supply voltage of a circuit. For example, an input signal that has a logic high of 2 V and a logic low of 1 V has a voltage range between 1 and 2 volts, e.g., a range of 1 V. Additionally, the signal voltage range of a first block can differ from the signal voltage range of a second block within a same circuit. Accordingly, the voltage of a logic high for each of the two blocks can differ. For example, assuming that the voltage of VCC 135 is 3.3 V, a voltage for a logic high at the output of inverter 105 can be approximately 3.3 V. Alternatively, assuming the voltage of Vaux 160 is 1.8 V, a logic high at the output of inverter 110 can be approximately 1.8 V. As such, a signal voltage range of inverter 105 can differ from a signal voltage range of inverter 110.

Referring to FIG. 1 at a time $T_1$, the voltage of signal Vin 145 is in steady state at a logic high and approximately equal to VCC. As signal Vin 145 is the input signal to inverter 105, the output of inverter 105 is at a logic low and the voltage of signal Vout1 150 is approximately equal to GND. More particularly, with the voltage of signal Vin 145 approximately equal to VCC, pull-up device 120 is disabled and pull-down devices 125 and 130 are enabled. In one or more embodiments, signal Vin 145 can be implemented with two separate signals. A first of the two signals can be coupled to the gate terminal of pull-up device 120 and a second of the two signals can be coupled to the gate terminal of each of pull-down devices 125 and 130.

Enabling pull-down devices 125 and 130 creates a conductive pathway from node 170 to GND 140. The conductive pathway from node 170 to GND 140 can discharge nodes 170 and 175 until the voltage at each of nodes 170 and 175 is approximately equal to GND. With signal Vout1 150 being the input signal to inverter 110 and at a logic low, the output signal from inverter 110, which is denoted as Vout2 155, is at a logic high. When at a logic high, the voltage of signal Vout2 155 is approximately equal to the voltage of Vaux 160. In one embodiment, Vaux 160 can represent a supply voltage that provides power to inverter 110 and that is separate and distinct from VCC 135. For example, Vaux 160 can be a predetermined reference voltage established within, or provided to, inverter 110 as a separate and distinct voltage source from VCC 135.

Continuing at time $T_1$, the voltage at the gate terminal of switch 115, being coupled to signal Vout2 155, is approximately Vaux. The voltage at the source terminal of switch 115 is approximately Vaux. As switch 115 can be implemented with a PFET device, the gate terminal to source terminal voltage ($V_{gs}$) of switch 115 is approximately zero volts. With the $V_{gs}$ of switch 115 being approximately equal to zero volts, switch 115 is disabled. The disabling of switch 115 decouples Vaux 160 from node 175. With switch 115 disabled and pull-down devices 125 and 130 enabled, the voltage at node 175 is approximately GND. It should be noted that at time $T_1$, the voltage at the source terminal of each of pull-down devices 125 and 130 is approximately GND. Subsequent to time $T_1$, and prior to time $T_2$, signal Vin 145 can begin transitioning from a logic high to a logic low. The voltage at the gate terminals of each of pull-up device 120 and pull-down devices 125 and 130 transitions from approximately VCC to GND.

During the period of time from time $T_1$ to time $T_2$, the $V_{gs}$ across pull-up device 120 transitions from approximately zero volts to approximately VCC. Additionally, during the period of time from time $T_1$ to time $T_2$, the $V_{gs}$ across each of pull-down devices 125 and 130 transitions from approximately VCC to approximately zero volts.

As the $V_{gs}$ across pull-up device 120 increases, pull-up device 120 is enabled. As $V_{gs}$ across pull-down devices 125 and 130 decreases, pull-down devices 125 and 130 are disabled. As signal Vin 145 transitions from a logic high to a logic low, at a particular voltage of signal Vin 145, pull-up device 120 sources, and each of pull-down devices 125 and 130 sinks, a substantially equal quantity of current. At the particular voltage of signal Vin 145 that results in equal quantities of current being sourced and sunk within inverter 105 by each of devices 120, 125, and 130, the voltage at node 170 is approximately one half of VCC.

The particular voltage of signal Vin 145 at which the voltage at node 170 is approximately one half VCC can be considered a first threshold voltage at which the output of inverter 105 changes state from a logic low to a logic high. The particular voltage of signal Vin 145 at which the first threshold voltage of inverter 105 occurs is affected by one or more device characteristics of each of pull-up device 120 and pull-down devices 125 and 130. For example, the particular voltage of the first threshold voltage is affected by the sizing ratio between the size of pull-up device 120 and the size of each of pull-down devices 125 and 130.

It should be noted that at time $T_1$ switch 115 is disabled. Being disabled, switch 115 cannot source current to pull-down device 130. As a result, as signal Vin 145 transitions from a logic high to a logic low, the current through pull-down device 130 is substantially equal to the current, denoted as $I_{125}$, sourced through pull-down device 125. Since the $V_{gs}$ of a CMOS device is a function of the current flowing through the CMOS device, as signal Vin 145 transitions from a logic high to a logic low, the Vgs of pull-down device 130 is a function of $I_{125}$.

As inverter 105 crosses the first threshold voltage, signal Vout1 150 transitions from approximately zero volts to approximately VCC. With signal Vout1 150 at a logic high, inverter 110 changes state and signal Vout2 155 transitions to a logic low. As signal Vout2 155 transitions from a logic high to a logic low, the $V_{gs}$ across switch 115 transitions from approximately zero volts to approximately negative Vaux. As the $V_{gs}$ across switch 115 decreases, switch 115 is enabled. Enabling switch 115 couples Vaux 160 to node 175.

It should be noted that subsequent to Vaux 160 being coupled to node 175, the operating conditions for pull-down device 125 are altered with the voltage at the source terminal of pull-down device 125 transitioning from approximately zero volts to approximately Vaux. With the voltage at the source terminal of pull-down device 125 at Vaux, the voltage required at the gate terminal of pull-down device 125 to enable pull-down device 125 must increase from the voltage required at time $T_1$.

Continuing, subsequent to time $T_2$ and prior to time $T_3$, signal Vin 145 can begin transitioning from a logic low to a logic high. The voltage at the gate terminals of pull-up device 120, pull-down device 125, and pull-down device 130 transitions from approximately GND to approximately VCC. During the period of time from time $T_2$ to time $T_3$, the $V_{gs}$ across pull-up device 120 transitions from approximately VCC to approximately zero volts. Additionally, during the period of time from time $T_2$ to time $T_3$, the voltage at the gate terminal of each of pull-down devices 125 and 130 transitions from approximately zero volts to approximately VCC.

As the $V_{gs}$ across pull-up device 120 decreases, pull-up device 120 is disabled. As the voltage at the gate terminal of each of pull-down devices 125 and 130 increases, initially only the $V_{gs}$ of pull-down device 130 increases sufficiently to enable pull-down device 130 as the source terminal of pull-down device 130 is coupled to GND 140. While the source terminal of pull-down device 130 is coupled to GND 140, the source terminal of pull-down device 125 is coupled to node 175. Node 175 is initially coupled to Vaux 160 through switch 115. With the voltage at the source terminal of pull-down device 125 initially at approximately Vaux, the gate voltage necessary to enable pull-down device 125 is greater than the gate voltage necessary to enable pull-down device 130. In that case, pull-down device 130 is enabled prior to the enabling of pull-down device 125.

The enabling of pull-down device 130 results in pull-down device 130 being simultaneously enabled with switch 115. Enabled pull-down device 130 can attempt to sink charge away from node 175 to GND 140. Concurrently, switch 115 can attempt to source charge to node 175 from Vaux 160. The size of the device used to implement pull-down device 130 relative to the size of the device used to implement switch 115 can be such that the current carrying capabilities of pull-down device 130 exceeds switch 115. Sized in this manner, pull-down device 130 can sink more current than switch 115 can source. Accordingly, with each of pull-down device 130 and switch 115 enabled simultaneously, the voltage at node 175 can begin discharging down from approximately Vaux.

It should be noted that at time $T_2$ switch 115 is enabled. Being enabled, switch 115 sources current, denoted as $I_{115}$, to pull-down device 130. As a result, as signal Vin 145 transitions from a logic low to a logic high, the current through pull-down device 130 is equal to a sum of $I_{115}$ and $I_{125}$. In contrast, the current through pull-down device 130 as signal Vin 145 transitions from logic high to a logic low is equal to $I_{125}$. Accordingly, the value of $V_{gs}$ required to sink current through pull-down device 130 as signal Vin 145 transitions from logic high to a logic low is less than the value of $V_{gs}$ required to sink current through pull-down device 130 as signal Vin 145 transitions from logic low to a logic high. The additional current that is provided when switch 115 is enabled alters the location of the second threshold voltage at which Schmitt trigger 100 changes state from the location of the first threshold voltage at which Schmitt trigger 100 changes state. In this manner, hysteresis is introduced into Schmitt trigger 100.

The enabling of pull-down device 125, subsequent to the enabling of pull-down device 130, creates a conductive pathway between node 170 and GND 140. Through the conductive pathway, charge flows away from node 170 until the voltage at node 170 reaches approximately GND. Sizing pull-down device 130 and switch 115 to achieve a particular sizing ratio, a second threshold voltage that is higher than the first threshold voltage can be selected for Schmitt trigger 100. The first threshold voltage can be triggered by a falling edge of Vin 145. The second threshold voltage can be triggered by a rising edge of Vin 145.

Subsequent to signal Vout1 150 transitioning to a logic low, signal Vout2 155 transitions to a logic high. With signal Vout2 155 at a logic low, the $V_{gs}$ across switch 115 approaches zero volts and switch 115 is disabled. Disabling switch 115 decouples Vaux 160 from node 175, thereby allowing pull-down device 130 to pull the voltage at node 175 to approximately GND. At time $T_3$, Schmitt trigger 100 achieves the same operational steady state as initially described at time $T_1$. Subsequent to time $T_3$, the operational behavior of Schmitt trigger 100 can repeat according to Vin 145 as described.

Within some electronic systems, an IC implemented within the system can be required to operate using a supply voltage that varies across a range of voltages. For example, an IC can be required to operate with both a 2.7 V supply voltage and a 3.3 V supply voltage. In addition, the IC also can be designed to operate within ±10% of the voltage specified for the supply voltage, e.g., 3.0-3.6 V for a 3.3 V supply voltage. For these reasons, the IC must remain stable and operable over a range of possible supply voltages.

In a conventional Schmitt trigger, switch 115 is implemented with an NFET device that, when enabled, couples VCC 135 to node 175. A source terminal of the NFET device is coupled to node 175. A gate terminal of the NFET device is coupled to node 170 and a drain terminal of the NFET device is coupled to VCC 135. As the voltage of the voltage source coupled to node 175 by switch 115, i.e., approximately VCC, influences the second threshold voltage, any variation in the voltage of VCC 135 can vary the location of the second threshold voltage of the conventional Schmitt trigger.

In addition, the NFET device used to implement switch 115 within a conventional Schmitt trigger is enabled by the output of inverter 105, i.e., signal Vout1 150. The NFET device used to implement switch 115 is enabled in the conventional Schmitt trigger when signal Vout1 150 is a logic high. Since signal Vout1 150 is the output signal of inverter 105, the voltage associated with a logic high in signal Vout1 150 is determined by the voltage of VCC 135 when powering inverter 105. As the voltage of VCC 135 varies, the $V_{gs}$ across the NFET device used to implement switch 115 varies.

Further, the current driving capability and $R_{on}$ of the NFET device in the conventional Schmitt trigger is a function of the $V_{gs}$ across the NFET device. The current driving capability and $R_{on}$ of the NFET device influences the location of the second threshold voltage of the conventional Schmitt trigger. As a result, any variation in the voltage of VCC 135 can vary the current driving capability and $R_{on}$ of the NFET device and the location of the second threshold voltage of the conventional Schmitt trigger.

In accordance with one or more embodiments disclosed within this specification, the voltage source coupled to node 175 is Vaux 160. Vaux 160 can be implemented with a stable voltage source that is independent of VCC 135 and, thus, any variation in VCC 135. In addition, the PFET device used to implement switch 115 within Schmitt trigger 100 is enabled when signal Vout2 155 transitions to a logic low. The voltage associated with a logic low within signal Vout2 155 is approximately the voltage of GND 140. The voltage associated with GND 140 can be considered a stable voltage that is independent of VCC 135. As a result, in an enabled state, switch 115 is driven by a stable voltage that is independent of VCC 135.

Within Schmitt trigger 100, the voltage of Vaux 160 is unaffected by voltage variations within VCC 135. Accordingly, switch 115 is enabled with a stable voltage independent of VCC 135. As a result, the embodiments disclosed within this specification are not subject to variations in the location of the second threshold voltage caused by variations in the voltage of VCC 135 as is the case with conventional Schmitt triggers.

Figure 2:
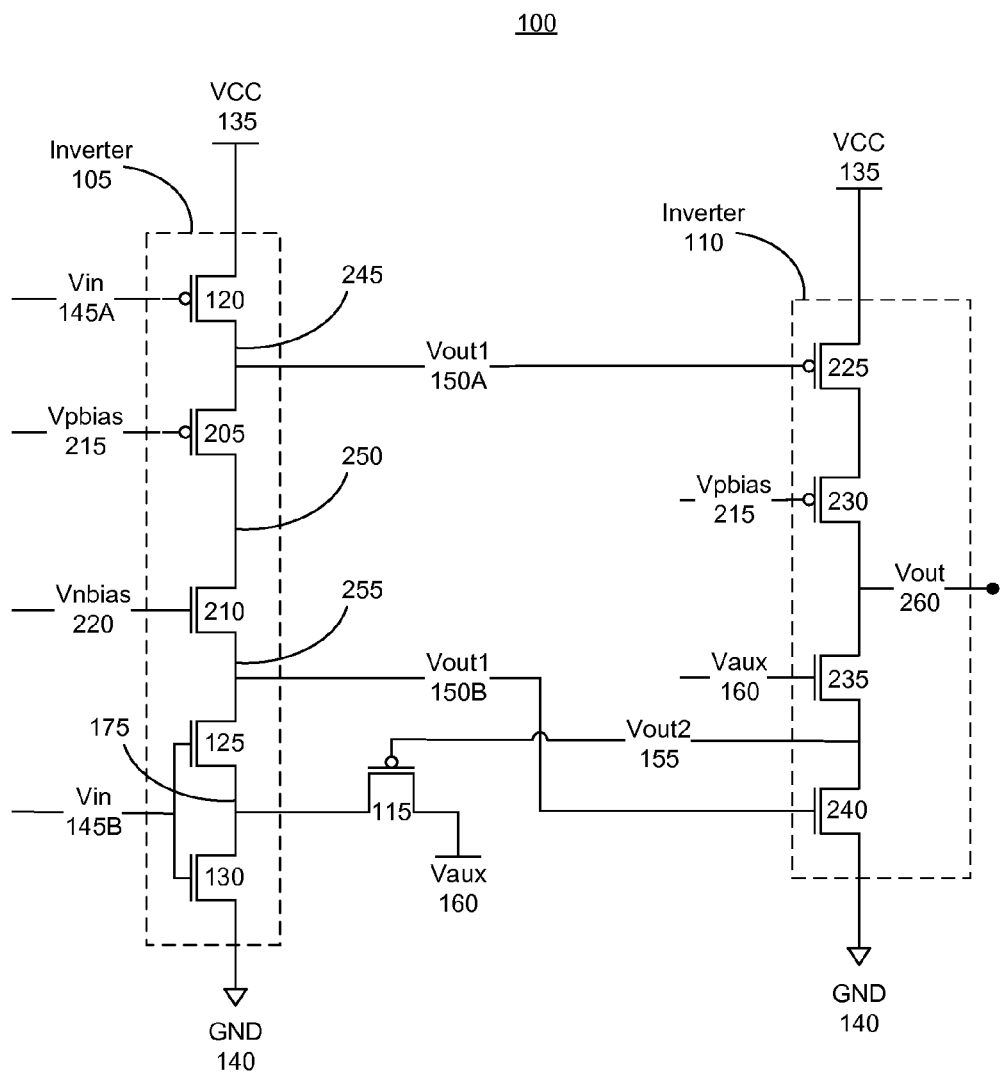
FIG. 2 is a second schematic diagram illustrating the Schmitt trigger inverter circuit of FIG. 1 in accordance with another embodiment.

FIG. 2 is a second schematic diagram illustrating the Schmitt trigger 100 of FIG. 1. FIG. 2 illustrates a more detailed view of Schmitt trigger 100. As such, like numbers are used to refer to the same items throughout this specification. FIG. 2 illustrates an embodiment of Schmitt trigger 100 that allows NFET and PFET devices to be implemented within Schmitt trigger 100 that possess voltage tolerances less than a supply voltage powering Schmitt trigger 100. Thus, the embodiment of Schmitt trigger 100 illustrated in FIG. 2 can be implemented within an IC powered by, or receiving, a voltage greater than the voltage tolerance of one or more CMOS devices of an IC manufacturing process within which the IC is implemented.

As pictured in FIG. 2, inverter 105 can include pull-up device 205 and a pull-down device 210, each being an additional device not previously described with reference to FIG. 1. A gate terminal of pull-up device 205 can be coupled to a voltage source Vpbias 215. Vpbias 215 can provide a static voltage that biases pull-up device 205 to a selected operating point. Pull-down device 210 can be coupled to a voltage source Vnbias 220. Vnbias 220 can provide a static voltage that biases pull-down device 210 to a selected operating point. Within FIG. 2, inverter 105 receives a pair of input signals denoted as signals Vin 145A and Vin 145B as opposed to a single input signal as illustrated within FIG. 1. In this regard, inverter 105 outputs a pair of output signals denoted as signals Vout1 150A and Vout1 150B.

As device feature size decreases in CMOS IC processes, electric fields generated across junctions within a CMOS device can increase as a power supply voltage to the CMOS device remains constant. The same increase in electric field also can occur across oxide layers within CMOS processes, e.g., gate oxides, as oxide layers decrease in thickness. When large enough, electric fields can damage junctions and oxide layers within the CMOS device. Additionally, large electric fields can degrade performance parameters of the CMOS device. To prevent damage to CMOS devices as device feature size is reduced, the maximum voltage applied to a CMOS device must be scaled downward.

VCC 135 represents a supply voltage with a voltage greater than the breakdown voltages of the CMOS devices used to implement Schmitt trigger 100. As the voltage of VCC 135 is greater than the breakdown voltages of pull-up device 120, pull-up device 205 can be implemented within inverter 105 to prevent the full voltage of VCC 135 from being applied across any two terminals of pull-up device 120. Within this specification, the phrase "breakdown voltage," also denoted as "$V_{BK}$," can refer to a highest voltage that can be applied across any two terminals of a CMOS device without damaging a junction and/or a dielectric layer within the CMOS device.

For purposes of illustration, the value of the $V_{BK}$ can be assumed to be common to each pair of terminals of each CMOS device type. The embodiments disclosed herein, however, are not intended to be limited by the commonality of $V_{BK}$ across devices. For example, CMOS devices implemented within most modern IC manufacturing processes can possess two or more values for $V_{BK}$ depending upon which terminal pair of the CMOS device the value of $V_{BK}$ is associated. In illustration, a gate terminal to source terminal value of $V_{BK}$ for a CMOS device can differ from a drain terminal to source terminal value of $V_{BK}$ for the CMOS device.

In order to protect pull-up devices 120 and 205 from voltages exceeding $V_{BK}$, a voltage can be selected for Vpbias 215 such that Vpbias is less than or equal to $V_{BK}$, and VCC minus Vpbias is less than or equal to $V_{BK}$. In addition, $V_{BK}$ for each CMOS device within Schmitt trigger 100 must be greater than one half of approximately VCC. With Vpbias 215 coupled to the gate terminal of pull-up device 205, pull-up device 205 is disabled when the voltage of signal Vout 150A is less than or equal to Vpbias 215. In that case, the $V_{gs}$ across pull-up device 205 is approximately zero volts, thereby assuring that pull-up device 205 is disabled.

Since pull-up device 205 is disabled when signal Vout 150A is less than or equal to Vpbias 215, the voltage at the source terminal of pull-up device 205 cannot be discharged below Vpbias 215. Accordingly, the voltage range of signal Vout1 150A is limited to a range defined by VCC and Vpbias. In that case, the $V_{gs}$ across pull-up device 205 cannot exceed VCC minus Vpbias. In addition, neither the gate terminal to drain terminal voltage ($V_{gd}$) nor the drain terminal to source terminal voltage ($V_{ds}$) applied across pull-up device 205 can exceed Vpbias. With Vpbias selected such that Vpbias is less than or equal to $V_{BK}$, and VCC minus Vpbias being less than or equal to $V_{BK}$, each of the $V_{gs}$, the $V_{gd}$, and the $V_{ds}$ across pull-up device 205 cannot exceed $V_{BK}$.

Further, with voltage of signal Vout1 150A unable to discharge below Vpbias, pull-up device 120 can be protected by limiting the voltage range of signal Vin 145A to vary between VCC and Vpbias. With the voltage range of signal Vin 145A limited in this manner, each of the $V_{gs}$, the $V_{gd}$, and the $V_{ds}$ across pull-up device 120 cannot exceed $V_{BK}$.

For example, Schmitt trigger 100 can be implemented using CMOS devices with a $V_{BK}$ of 1.8 V. VCC can be equal to 3.3 V and Vpbias can be selected to be 1.65 V. The voltage range of Vin 145A can be limited to vary between 1.65 V and 3.3 V. When Schmitt trigger 100 is operational, node 250 can swing between GND and VCC. Under these conditions, the maximum $V_{gd}$ across pull-up device 205 is 1.65 V, i.e., 3.3 V−1.65 V or 1.65 V−0 V. The maximum $V_{gs}$ is 1.65 V, i.e., 3.3 V−1.65 V. The maximum $V_{ds}$ occurs when signal Vin 150A is a logic high and pull-up device 205 is disabled. In that case, the $V_{ds}$ is 1.65 V with the voltage of signal Vout1 150A being equal to approximately 1.65 V and the voltage at node 245 being equal to approximately zero volts.

With signal Vout1 150A varying between 1.65 V and 3.3 V, the voltage at the gate terminal of pull-up device 120 at 1.65 V, and the voltage at the source terminal of pull-up device 120 at 3.3 V, each of the $V_{gs}$, the $V_{gd}$, and the $V_{ds}$ of pull-up device 120 cannot exceed 1.65 V. With the $V_{gs}$, the $V_{gd}$, and the $V_{ds}$ of each of pull-up devices 120 and/or 205 not exceeding 1.65 V and $V_{BK}$ equal to 1.8 V, each of pull-up devices 120 and 205 is protected from receiving a voltage exceeding $V_{BK}$.

As noted, the voltage range of signal Vout1 150A can vary between Vpbias and VCC. Signal Vout1 150A is coupled to the gate terminal of pull-up device 225 within inverter 110. Vpbias 215 is coupled to the gate terminal of pull-up device 230 within inverter 110. With the selected voltage range of signal Vin 145A being approximately equal to the voltage range of signal Vout1 150A, the operating conditions for pull-up devices 225 and 230 are approximately equal to the operation conditions for pull-up devices 120 and 205. For this reason, under these same operating conditions, each of the $V_{gs}$, the $V_{gd}$, and the $V_{ds}$ of each of pull-up devices 225 and 230 does not exceed $V_{BK}$.

The techniques used to protect pull-up devices 120 and 205 can be applied to protect pull-down devices 125, 130, and 210. Referring to FIG. 2, pull-down device 210 is added to inverter 105 in order to limit voltage across any pair of terminals of pull-down devices 125 and 130 to less than or equal to $V_{BK}$. To protect pull-down devices 125 and 130, Vnbias can be selected such that Vnbias is less than or equal to $V_{BK}$, and VCC minus Vnbias is less than or equal to $V_{BK}$. With Vnbias 220 coupled to the gate terminal of pull-down device 210, the voltage of signal Vout1 150B is prevented from increasing above Vnbias.

For example, VCC can be 3.3 V and Vnbias can be selected to be 1.65 V. $V_{BK}$ for the CMOS devices used to implement Schmitt trigger 100 can be 1.8 V. The selected voltage of 1.65 V for Vnbias meets the conditions that the voltage of Vnbias be less than or equal to $V_{BK}$, i.e., 1.65 V is less than 1.8 V, and VCC minus Vnbias be less than or equal to $V_{BK}$, i.e., 3.3 V−1.65 V=1.65 V, which is less than 1.8 V. As the voltage at node 255 approaches 1.65 V, the $V_{gs}$ for pull-down device 210 approaches zero volts and pull-down device 210 is completely disabled. For this reason, signal Vout1 150B is limited to a voltage range of 0 V to 1.65 V before pull-down device 210 is disabled and no further charge can be sourced through pull-down device 210 to node 255.

With the voltage of signal Vout1 150B limited to Vnbias, signal Vin 145B can be implemented with a voltage range varying between GND and Vnbias. Limiting the voltage range of signal Vin 145B to be less than or equal to Vnbias assures that, for each of pull-down devices 125, 130, and 220, each of the $V_{gs}$, the $V_{gd}$, and the $V_{ds}$ does not exceed $V_{BK}$.

Signal Vout1 150B is coupled to the gate terminal of pull-down device 240 within inverter 110. Vaux 160 is coupled to the gate terminal of pull-down device 235 within inverter 110. Vaux can be selected to meet the conditions set forth for Vnbias, i.e., where Vaux is less than or equal to $V_{BK}$, and VCC minus Vaux is less than or equal to $V_{BK}$. Selecting Vaux that meets these conditions assures that the $V_{gs}$, the $V_{gd}$, and the $V_{ds}$ for each of pull-down devices 235 and 240 does not exceed $V_{BK}$.

With Vaux 160 coupled to the gate terminal of pull-down device 235, pull-down device 235 is disabled upon the voltage of signal Vout2 155 increasing to Vaux. As a result, the voltage range of signal Vout2 155 is limited to varying between GND and Vaux. By selecting Vaux to be less than the lowest possible voltage allowable for VCC as a supply voltage to Schmitt trigger 100, the voltage of signal Vout2 155 can be assured of increasing to Vaux regardless of the voltage of VCC. As such, the voltage range of signal Vout2 155 remains constant even as the voltage of VCC varies.

It should be noted that the output signal from Schmitt trigger 100 is represented with signal Vout 260. The voltage range of signal Vout 260 is approximately 0 V to the voltage of VCC 135. Should a voltage limited output signal be desired from Schmitt trigger 100, the output signal can be output at the coupling point between the drain terminal of pull-up device 225 and the source terminal of pull-up device 230 and/or the coupling point between the drain terminal of pull-down device 240 and the source terminal of pull-down device 235. As such, implementation of the output signal from Schmitt trigger 100 with signal Vout 260, as described within this specification, is for descriptive purposes only and is not intended to limit the embodiments disclosed within this specification.

Signal Vout2 155 is coupled to the gate terminal of switch 115 and controls the enabling and disabling of switch 115. To assure that switch 115 is fully disabled, the $V_{gs}$ for switch 115 must approach zero volts. As the source terminal of switch 115 is coupled to Vaux 160, in order to achieve a $V_{gs}$ of zero volts across switch 115, the voltage of signal Vout2 155 must increase to Vaux.

Switch 115 is enabled when signal Vout2 155 is a logic low and a voltage of approximately GND 140 is applied to the gate terminal of switch 115. Since GND 140 is a voltage source independent of VCC 135, the enabling of switch 115 is not affected by variation in VCC. The source terminal of switch 115 is coupled to Vaux 160, and a voltage of approximately that of Vaux 160 is coupled to node 175 subsequent to switch 115 being enabled. Since Vaux 160 is a voltage source independent of VCC 135, the voltage coupled to node 175 subsequent to switch 115 being enabled is independent of variations in the voltage of VCC 135.

As previously noted, within conventional Schmitt triggers, the voltage that enables switch 115 can be dependent upon VCC. Additionally, within conventional Schmitt triggers, the voltage coupled to node 175 can be VCC. Each of the voltages that enable switch 115 and the voltage coupled to node 175 can influence the location of the second threshold voltage within conventional Schmitt triggers. As such, conventional Schmitt trigger inverters are susceptible to changes in operational behavior that arise due to the second threshold voltage varying along with the voltage of VCC 135.

Within Schmitt trigger 100, the voltage that enables switch 115, the voltage that disables switch 115, and the voltage coupled to node 175 affects the location of the second threshold voltage within Schmitt trigger 100. Within Schmitt trigger 100, the voltage that enables switch 115, the voltage that disables switch 115, and the voltage coupled to node 175 each is independent of variations in the voltage of VCC. Thus, as VCC varies, the second threshold voltage within Schmitt trigger 100 remains constant.

Figure 3:
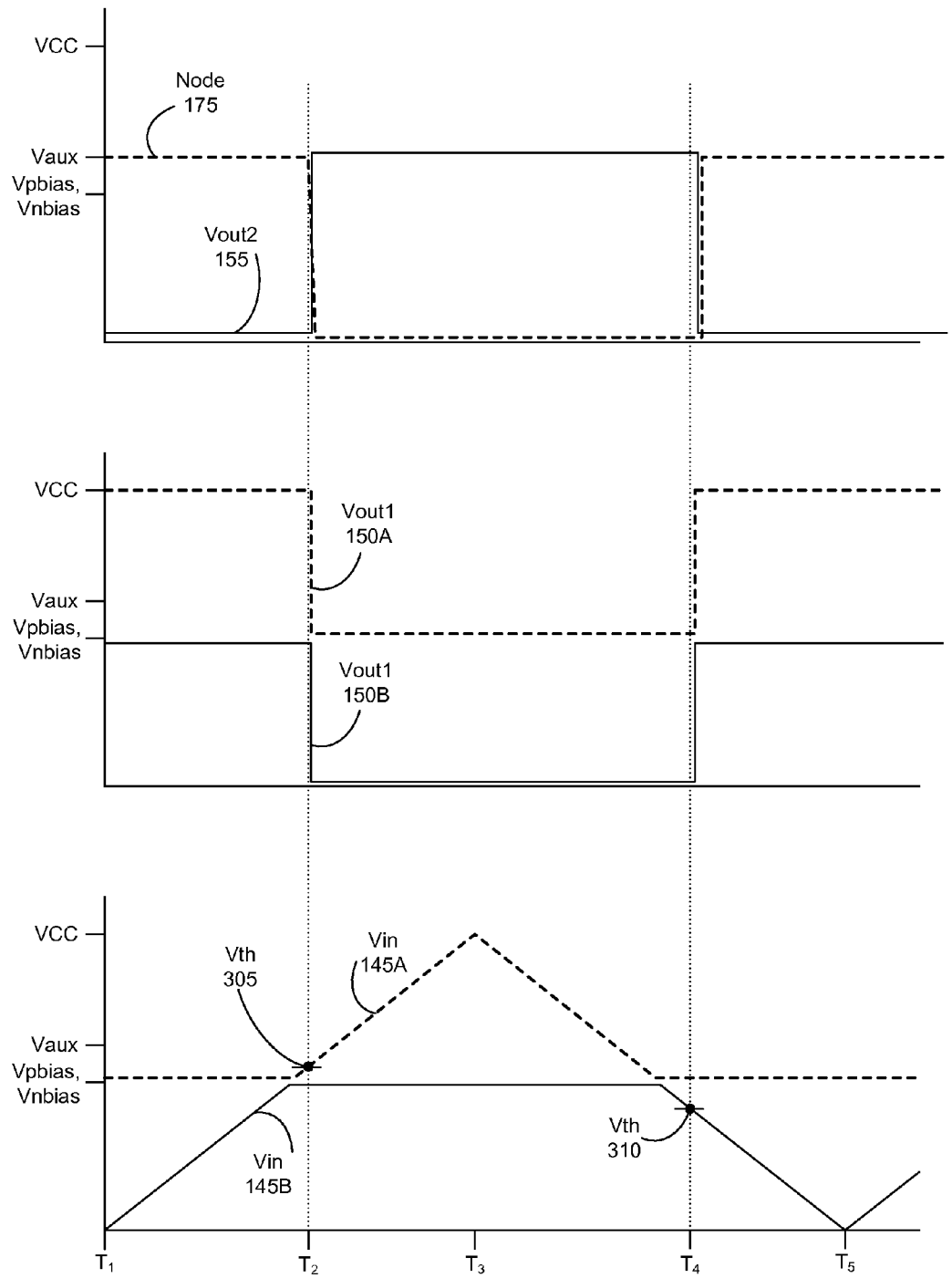
FIG. 3 is a signal graph illustrating exemplary signal changes at various nodes of a Schmitt trigger inverter circuit in accordance with another embodiment.

FIG. 3 is a signal graph illustrating exemplary signal changes at various nodes of Schmitt trigger 100 as described with reference to FIGS. 1 and 2. FIG. 3 illustrates a case where the input signal to the Schmitt trigger inverter 100 transitions from a logic low to a logic high and then transitions back to a logic low. Within FIG. 3, a ramp function is used as the input signal to Schmitt trigger 100, i.e., signals Vin 145A and 145B. Implementing signals Vin 145A and 145B as ramp functions provides clarity as to the voltage level of the two differing input voltage thresholds at which Schmitt trigger 100 changes state.

Beginning at a time $T_1$, signals Vin 145A and 145B are initially in a logic low state. Signal Vin 145A is implemented such that the voltage of signal Vin 145A cannot decrease below Vpbias. For that reason, the initial voltage of a logic low for signal Vin 145A is approximately Vpbias. Thus, the voltage of the segment of the ramp function within signal 145A residing between times $T_1$ and $T_2$ is truncated at approximately Vpbias. In a similar manner, Signal Vin 145B is implemented such that the voltage of signal Vin 145B cannot increase above Vnbias. Thus, the voltage of the segment of the ramp function within signal 145B residing between times $T_2$ and $T_4$ is truncated at approximately Vnbias.

Within FIG. 3, Vpbias is set equal to Vnbias. It should be appreciated, however, that Vpbias and Vnbias can be two different voltages. Vpbias is described with reference to FIG. 3 as being equal to Vnbias for descriptive purposes only. As such, the embodiments disclosed within this specification are not limited to Vpbias being equal to Vnbias.

At time $T_1$, input signals Vin 145A and Vin 145B are providing logic lows as inputs to inverter 105 of FIG. 2. With the input signal to inverter 105 being a logic low, output signals Vout1 150A and Vout2 150B of inverter 105 are logic highs. The voltage of a logic high for signal Vout1 150B is limited to Vnbias. Assuming the voltages Vpbias and Vnbias are selected to be less than a $V_{BK}$ associated with the CMOS devices used to implement Schmitt trigger 100, limiting the voltage range of each of signals Vin 145A, Vin 145B, Vout1 150A, and Vout1 150B limits the voltage applied across any pair of terminals within each CMOS device of Schmitt trigger 100 to less than $V_{BK}$. Limiting the voltage of signals Vin 145A, Vin 145B, Vout1 150A, and Vout1 150B allows Schmitt trigger 100 to be implemented with CMOS devices having a $V_{BK}$ less than VCC.

Since signals Vout 150A and 150B are inputting a logic high to inverter 110, output signal Vout2 155 from inverter 110 is a logic low. When at a logic low, signal Vout2 155 discharges the gate terminal of switch 115 to approximately zero volts and switch 115 is enabled. With switch 115 enabled, Vaux 160 is coupled to node 175 and the voltage at node 175 is approximately Vaux.

Subsequent to time $T_1$ and prior to a time $T_2$, the voltage of signal Vin 145A exceeds Vpbias and signal Vin 145A begins increasing, consistent with a ramp function, toward VCC. Concurrently, the voltage of signal Vin 145B increases to approximately Vnbias. As the voltage of signal Vin 145B is limited to Vnbias, the top of the ramp function is truncated at a voltage of Vnbias.

At time $T_2$, the voltage of signals Vin 145A and Vin 145B are sufficient to change the output state of inverter 105. In order to change the output state of inverter 105, node 175 must discharge sufficiently to allow pull-down device 125 within inverter 105 to be enabled. At time $T_2$, pull-up device 130 and switch 115 are both enabled. In addition, pull-down device 125 is transitioning from off to enabled and beginning to sink current from node 170. As such, pull-down device 130 simultaneously sinks current from switch 115 and pull-down device 125.

Eventually, pull-down device 130 sufficiently discharges node 175 to fully enable pull-down device 125. With pull-down device 125 enabled, inverter 105 changes logic state and output signals Vout1 150A and Vout1 150B of inverter 105 transition from a logic high to a logic low. The voltage of signal Vout1 150A decreases to Vpbias as signal Vout1 150A transitions to a logic low. The voltage of signal Vout1 150B decreases to approximately zero volts as signal Vout1 150B transitions to a logic low.

With signals Vout1 150A and Vout1 150B provided to inverter 110 at logic lows, output signal Vout2 155 from inverter 110 transitions to a logic high. The voltage of signal Vout2 155 at a logic high is approximately Vaux. Applying a voltage of approximately Vaux to the gate terminal of switch 115 disables switch 115. Disabling switch 115 decouples Vaux 160 from node 175. As switch 115 decouples Vaux 160 from node 175, node 175 can continue discharging until the voltage at node 175 is approximately zero volts. The voltage level of signals Vin 145A and Vin 145B at which the logic state of Schmitt trigger 100 changes is a threshold voltage for the Schmitt trigger 100. Vth 305 denotes the second threshold voltage of Schmitt trigger 100 that occurs as signals Vin 145A and Vin 145B transition from a logic low to a logic high.

Subsequent to time $T_2$, signal Vin 145A continues increasing in voltage and signal Vin 145B increases to a logic high with a voltage limited at approximately Vnbias. At time $T_3$, each of signals Vin 145A and Vin 145B begin transitioning to a logic low. At time $T_4$, the voltage of each of signals Vin 145A and Vin 145B decreases sufficiently to alter the output state of inverter 105 from a logic low to a logic high. Vth 310 denotes the voltage level of each of signals Vin 145A and Vin 145B that transitions the output state of inverter 105 from a logic low to a logic high.

As inverter 105 changes output state to a logic high, each of signals Vout1 150A and Vout1 150B transition to a logic high. With each of signals Vout1 150A and Vout1 150B at a logic high, the output state of inverter 110 transitions to a logic low. Accordingly, the voltage of signal Vout2 155 decreases to approximately zero volts and switch 115 is enabled. With switch 115 enabled, Vaux 160 is coupled to node 175 and the voltage at node 175 increases to approximately Vaux. With Vaux 160 coupled to node 175, Schmitt trigger 100 has transitioned from one logic state to another. Therefore, voltage Vth 310 represents the first threshold voltage of Schmitt trigger 100 that occurs as signals Vin 145A and Vin 145B transition from a logic high to a logic low.

It should be noted that at time $T_2$, node 175 begins transitioning prior to signals Vout1 150A, Vout1 150B, and Vout2 155. This occurs as the voltage at node 175 must be decreased sufficiently to fully enable pull-down device 125 and allow inverter 105 to change states. Alternatively, at time $T_4$ node 175 transitions subsequent to signals Vout1 150A, Vout1 150B, and Vout2 155. This occurs as the voltage at node 175 cannot change until switch 115 is enabled and Vaux is coupled to node 175. Subsequent to time $T_4$, switch 115 cannot be enabled until signal Vout2 155 changes state and the voltage at the gate terminal of switch 115 is discharged to zero volts.

In addition, the threshold voltage level of signals Vin 145A and Vin 145B at time $T_2$, i.e., Vth 305, differs from the threshold voltage level of signals Vin 145A and Vin 145B at time $T_4$, i.e., Vth 310. Further, at time $T_2$ the voltage at node 175 is higher than the voltage at node 175 at time $T_4$. The increase in voltage at node 175 and current sourced by switch 115 at time $T_2$ requires a higher threshold voltage from signals Vin 145A and Vin 145B at time $T_2$ to change the state of inverter 105 than required to change the state of inverter 105 at time $T_4$. Thus, the difference in voltage at node 175 and current sourced by switch 115 between when signals Vin 145A and 145B transition from a logic high to a logic low, as compared to when signals Vin 145A and 145B transition from a logic low to a logic high, produces the hysteresis that is inherent within Schmitt trigger 100.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A Schmitt trigger inverter circuit for use within an integrated circuit (IC), the circuit comprising:
   a first inverter comprising a first pull-up device, a first pull-down device, and a second pull-down device, wherein the first inverter is configured to receive an input signal;
   a second inverter coupled in series with the first inverter and comprising an output configured to generate an output signal;
   a switch coupled to the output of the second inverter that is selectively enabled responsive to the output signal;
   wherein a source terminal of the second pull-down device is connected to a ground potential, and the switch is configured to couple a predetermined reference voltage to a source terminal of the first pull-down device when in an enabled state, the reference voltage being greater than the ground potential and less than a supply voltage powering the Schmitt trigger inverter circuit;
   wherein in response to the coupling of the predetermined reference voltage, a threshold voltage of the Schmitt trigger inverter circuit is altered such that the output signal of the second inverter is limited to a voltage range between the ground potential and the reference voltage, and the output signal is approximately equal to the reference voltage in response to the input signal being equal to the supply voltage.

2. The Schmitt trigger inverter circuit of claim 1, wherein:
   the switch comprises a P-type field effect transistor (PFET) device; and
   the PFET device comprises:
     a gate terminal coupled to the output of the second inverter;
     a source terminal coupled to the predetermined reference voltage; and
     a drain terminal coupled to the source terminal of the first pull-down device.

3. The Schmitt trigger inverter circuit of claim 1, wherein the first inverter further comprises:
- a second pull-up device comprising a source terminal coupled to a drain terminal of the first pull-up device and a gate terminal coupled to a first bias voltage; and
- a third pull-down device comprising a source terminal coupled to a drain terminal of the first pull-down device, a drain terminal coupled to a drain terminal of the second pull-up device, and a gate terminal coupled to a second bias voltage.

4. The Schmitt trigger inverter circuit of claim 3, wherein the first pull-up device and the second pull-up device each comprises a P-type field effect transistor (PFET) device.

5. The Schmitt trigger inverter circuit of claim 3, wherein the first bias voltage is set to a selected voltage that limits a voltage across each of the first pull-up device and the second pull-up device to not exceed a voltage tolerance associated with each of the first pull-up device and the second pull-up device respectively during operation of the Schmitt trigger inverter circuit.

6. The Schmitt trigger inverter circuit of claim 3, wherein the first pull-down device, the second pull-down device, and the third pull-down device each comprises an N-type field effect transistor (NFET) device.

7. The Schmitt trigger inverter circuit of claim 3, wherein the second bias voltage is set to a selected voltage that limits a voltage across each of the first pull-down device, the second pull-down device, and the third pull-down device to not exceed a voltage tolerance associated with each of the first pull-down device, the second pull-down device, and the third pull-down device respectively during operation of the Schmitt trigger inverter circuit.

8. The Schmitt trigger inverter circuit of claim 1, wherein the second inverter further comprises:
- a second pull-up device comprising a drain terminal, a source terminal coupled to a supply voltage powering the Schmitt trigger inverter circuit, and a gate terminal coupled to the output of the first inverter;
- a third pull-up device comprising a drain terminal, a source terminal coupled to the drain terminal of the second pull-up device, and a gate terminal coupled to a first bias voltage;
- a third pull-down device comprising a source terminal, a drain terminal coupled to the drain terminal of the third pull-up device, and a gate terminal coupled to the predetermined reference voltage; and
- a fourth pull-down device comprising a drain terminal coupled to the source terminal of the third pull-down device, a source terminal coupled to a ground potential, and a gate terminal coupled to the output of the first inverter,
- wherein the output of the second inverter is a node coupling the source terminal of the third pull-down device and the drain terminal of the fourth pull-down device.

9. The Schmitt trigger inverter circuit of claim 8, wherein:
- the second pull-up device and the third pull-up device each comprise a P-type field effect transistor (PFET) device; and
- the third pull-down device and the fourth pull-down device each comprise an N-type field effect transistor (NFET) device.

10. A Schmitt trigger inverter circuit disposed in a complementary metal oxide semiconductor (CMOS) integrated circuit (IC), the Schmitt trigger inverter circuit comprising:
- a first inverter comprising a first P-type field effect transistor (PFET) device, a first N-type field effect transistor (NFET) device, and a second NFET device, wherein the first inverter is configured to receive an input signal;
- a second inverter coupled in series with an output of the first inverter and comprising an output configured to generate an output signal; and
- a PFET switch comprising a gate terminal coupled to an output of the second inverter, a source terminal coupled to a predetermined reference voltage, and a drain terminal coupled to the source terminal of the first NFET device,
- wherein the PFET switch is configured to couple the predetermine voltage to the source terminal of the first NFET device when in an enabled state, and wherein the predetermined reference voltage is independent of a supply voltage powering the Schmitt trigger inverter circuit.

11. The Schmitt trigger inverter circuit of claim 10, wherein a voltage range of the output signal of the second inverter varies between a ground potential and the predetermined reference voltage.

12. The Schmitt trigger inverter circuit of claim 10, wherein the first inverter further comprises:
- a second PFET device comprising a source terminal coupled to a drain terminal of the first PFET device and a gate terminal coupled to a first bias voltage; and
- a third NFET device comprising a source terminal coupled to a drain terminal of the first NFET device, a drain terminal coupled to a drain terminal of the second PFET device, and a gate terminal coupled to a second bias voltage.

13. The Schmitt trigger inverter circuit of claim 12, wherein the first bias voltage and the second bias voltage each is selected to limit a voltage across each PFET device and NFET device to not exceed a voltage tolerance associated with each PFET device and NFET device of the Schmitt trigger inverter circuit during operation.

14. The Schmitt trigger inverter circuit of claim 10, wherein the second inverter further comprises:
- a second PFET device comprising a drain terminal, a source terminal coupled to the supply voltage, and a gate terminal coupled to the output of the first inverter;
- a third PFET device comprising a drain terminal, a source terminal coupled to the drain terminal of the second PFET device, and a gate terminal coupled to a bias voltage;
- a third NFET device comprising a source terminal, a drain terminal coupled to the drain terminal of the third PFET device, and a gate terminal coupled to the predetermined reference voltage; and
- a fourth NFET device comprising a drain terminal coupled to the source terminal of the third NFET device, a source terminal coupled to a ground potential, and a gate terminal coupled to the output of the first inverter,
- wherein the output of the second inverter is a node coupling the source terminal of the third NFET device and the drain terminal of the fourth NFET device.

15. A Schmitt trigger inverter circuit, comprising:
- a first inverter comprising a first pull-up device, a first pull-down device, and a second pull-down device;
- wherein the first inverter is configured to receive an input signal;
- a second inverter coupled in series with the first inverter and comprising an output configured to generate an output signal;
- wherein a voltage range of the output signal varies between a ground potential and a predetermined reference voltage, and wherein the predetermined reference voltage is independent of a supply voltage powering the Schmitt trigger inverter circuit;

a switch coupled to the output of the second inverter that is selectively enabled responsive to the output signal;

wherein the switch is configured to couple the predetermined reference voltage to a source terminal of the first pull-down device when in an enabled state; and wherein in response to the coupling of the predetermined reference voltage, a threshold voltage of the Schmitt trigger inverter circuit is altered such that the output signal of the second inverter is limited to a voltage range between the ground potential and the reference voltage, and such that the output signal is approximately equal to the reference voltage in response to the input signal being equal to the supply voltage.

16. The Schmitt trigger inverter circuit of claim 15, wherein the first inverter further comprises:
- a second pull-up device comprising a source terminal coupled to a drain terminal of the first pull-up device and a gate terminal coupled to a first bias voltage; and
- a third pull-down device comprising a source terminal coupled to a drain terminal of the first pull-down device, a drain terminal coupled to a drain terminal of the second pull-up device, and a gate terminal coupled to a second bias voltage.

17. The Schmitt trigger inverter circuit of claim 15, wherein:
- the switch comprises a P-type field effect transistor (PFET) device, and
- the PFET device comprises:
  - a gate terminal coupled to the output of the second inverter;
  - a source terminal coupled to the predetermined reference voltage; and
  - a drain terminal coupled to the source terminal of the first pull-down device.

18. The Schmitt trigger inverter circuit of claim 15, wherein the second inverter further comprises:
- a second pull-up device comprising a drain terminal, a source terminal coupled to a supply voltage powering the Schmitt trigger inverter circuit, and a gate terminal coupled to the output of the first inverter;
- a third pull-up device comprising a drain terminal, a source terminal coupled to the drain terminal of the second pull-up device, and a gate terminal coupled to a first bias voltage;
- a third pull-down device comprising a source terminal, a drain terminal coupled to the drain terminal of the third pull-up device, and a gate terminal coupled to the predetermined reference voltage; and
- a fourth pull-down device comprising a drain terminal coupled to the source terminal of the third pull-down device, a source terminal coupled to the ground potential, and a gate terminal coupled to the output of the first inverter,
- wherein the output of the second inverter is a node coupling the source terminal of the third pull-down device and the drain terminal of the fourth pull-down device.

\* \* \* \* \*